United States Patent [19]
Ueda et al.

[11] Patent Number: 5,288,543
[45] Date of Patent: Feb. 22, 1994

[54] PROTECTIVE FILM ON SLIDING MEMBERS AND METHOD OF FORMING SAME

[75] Inventors: Kunihiro Ueda; Masaru Ikebe; Morimasa Sasaki, all of Saku, Japan

[73] Assignee: TDK Corporation, Tokyo, Japan

[21] Appl. No.: 723,047

[22] Filed: Jun. 28, 1991

[30] Foreign Application Priority Data

Sep. 17, 1990 [JP] Japan .................. 2-243759

[51] Int. Cl.⁵ .............................. B32B 9/00
[52] U.S. Cl. ..................... 428/216; 428/217; 428/408; 428/469; 428/472; 428/698
[58] Field of Search ............ 428/408, 212, 217, 218, 428/698, 699, 701, 469, 472, 216

[56] References Cited

U.S. PATENT DOCUMENTS

| | | | |
|---|---|---|---|
| 3,900,592 | 8/1975 | Kennedy et al. | 428/212 |
| 4,636,435 | 1/1987 | Yanagihara et al. | 428/336 |
| 4,737,415 | 4/1988 | Ichijo et al. | 428/447 |
| 4,833,031 | 5/1989 | Kurokawa et al. | 428/408 |
| 4,877,677 | 10/1989 | Hirochi et al. | 428/408 |

*Primary Examiner*—A. A. Turner
*Attorney, Agent, or Firm*—Wood, Phillips, VanSanten, Hoffman & Ertel

[57] ABSTRACT

A protectively coated sliding member comprises a sliding member body, an anchor layer formed thereon and which consists of (a) a hydrocarbon or hydrocarbon-based plasma polymer film, (b) a diamond-like film, or (c) an ion-plating film of a metal or metallic compound, and a protective coating formed on the anchor layer and which consists of a hydrocarbon or hydrocarbon-based plasma polymer film in case where the anchor layer consists of (a), a diamond or diamond-like film in case of (b), or an ion-plating film of a metallic compound in case of (c). The protective coating is of greater hardness than the anchor layer.

1 Claim, 3 Drawing Sheets

PROTECTIVE FILM ON SLIDING MEMBERS AND METHOD OF FORMING SAME

BACKGROUND OF THE INVENTION

This invention relates to improvements in sliding members. More particularly, it concerns a technique of improving the adhesion of a wear-resistant protective coating for sliding members to the substrates.

Magnetic tape cassettes, such as for audio and video tapes, are provided with guide pins and other guide members that come in sliding contact with the magnetic tapes to guide the running tape properly and ensure its stability during running. Those guides for video tape cassettes are made of stainless steel (of grade SUS 304 or the like), brass, or aluminum, with plating, or of a hard resin such as polyacetal. For audio cassettes, guides of stainless steel or plastics such as polystyrene are used. Stainless steel members in video tape cassettes can be abraded by inorganic particles added to the back coating of the magnetic tapes. The abrasion, in turn, can cause dropout. For guides in audio cassettes, stainless steel is an ideal material but adds greatly to the cost. Plated brass or aluminum is again costly, and reduced surface roughness increases the coefficient of friction, giving adverse effects upon the running of tape. Polyacetal and other similar resins are easily scraped, and dusting results in deposition of minute particles on the surface of the recording medium, leading to dropout. In addition, a high friction coefficient is likely to hamper smooth running of the tape.

Optical and magnetic discs comprise recording media each built as a circular plate with a metallic rotating hub fitted securely in a central opening of the plate so as to support and drive it. The rotating hub has a center hole in which to receive a spindle pin and an off-center hole to receive an eccentric drive pin from a driving device. When the disc is set in a recording-reproducing device, the drive pin automatically comes in sliding contact with the surface of the hub to fit in the off-center hole. This can cause abrasion, scratching, and dusting of the hub surface.

FIG. 1 generally illustrates, in an exploded view, a magnetic disc as comprising an upper half housing section 11, a lower half housing section 12, and a magnetic disc 14 with a rotating hub 13 fitted securely in the center opening and contained, together with liner sheets 15, 16 on both sides, in the housing as the two half sections are put together. The rotating hub 13 has a square center hole 17 to receive a center spindle pin (not shown) of a reproducing device and an off-center square hole 18 to receive a drive pin (not shown) in an eccentric position. Inserting the complete disc into a record-playback device automatically causes the latter's spindle pin and drive pin to gain entrance into the corresponding holes of the disc. Because the pins are not always properly aligned to the holes 17, 18, the drive pin turns in sliding contact with the surface of the hub 13 until it finds out and fits into the hole 18. The rotating hub 13 usually used is made of stainless steel (SUS 430) with or without plating (e.g., hard chromium plating). Nevertheless, the hub portions that come in repeated contact with the metallic drive and spindle pins are gradually worn with dusting. The resulting particles tend to deposit on the disc surface, and such deposits can cause false recording or dropout, leading to malfunction in recording and reading of information. Other associated parts including the shutter that come in sliding contact whenever used can also present the above troubles unless they have adequate wear resistance.

Similar problems arise from the abrasion and dusting of magnetic heads in rubbing contact with magnetic tapes. Generally, sliding members of magnetic and optical-disc recording-reproducing devices located close to recording media have the possibilities of causing errors in recording and reproduction of information due to dusting with wear. The sliding members therefore are required to be as wear-resistant as possible. Although members of considerably better wear life have been introduced through improvements in materials, there is still demand for simpler methods of manufacture for cost reason.

Attempts have been made to form a wear-resistant protective coat, e.g., of SiC, TiN, TiC, or $Al_2O_3$, on the surface of such sliding members. However, the coatings do not necessarily have adequate adhesion or bonding properties with respect to the substrates. Dusting due to separation can still occur, resulting in dropout from the recording media.

Therefore, it is an object of the present invention to improve the binding force of a wear-resistant protective coating with respect to the substrate of sliding members.

Another object of the invention is to provide an efficient, low-cost process for forming such a wear-resistant protective coating.

BRIEF SUMMARY OF THE INVENTION

The present invention is characterized in that an anchor layer consisting of a plasma polymer film of a hydrocarbon or hydrocarbon-based monomer, a diamond-like film, or anion plating film of a metal or metallic compound, and a protective coating consisting of a plasma polymer film of a hydrocarbon or hydrocarbon-based monomer of the same type as used in the anchor layer, a diamond or diamond-like film, or an ion plating film of a metallic compound, the protective coating being greater in hardness than the anchor layer, are provided on the surface of sliding members.

When the protective coating consists of a plasma polymer film, the anchor layer is formed by plasma polymerization of a hydrocarbon or hydrocarbon-based monomer gas at a lower energy density than for the protective coating.

When the protective coating is a diamond or diamond-like film, the anchor layer is formed under a set of conditions so chosen as to give a diamond-like film of lower density than the protective coating.

When the protective coating is an ion plating film, it is formed from TiC, TiN, SiC, BN, $Al_2O_3$, or CrN, and the anchor film from a metallic compound of a lower hardness.

The concept of sliding members of the invention is applicable to magnetic tape guide members and contacting magnetic head surfaces of magnetic tape cassettes, disc-supporting rotating hubs of optical or magnetic disc devices and the like.

With the structure described, the protective coating of sliding members used in recording-playback devices is solidly bound to the substrate with the aid of the anchor layer. Thus, the sliding members can be protectively coated with good productivity, attaining good resistance to friction and wear at low cost.

DETAILED DESCRIPTION OF THE INVENTION

Plasma polymerization

Figure 1:
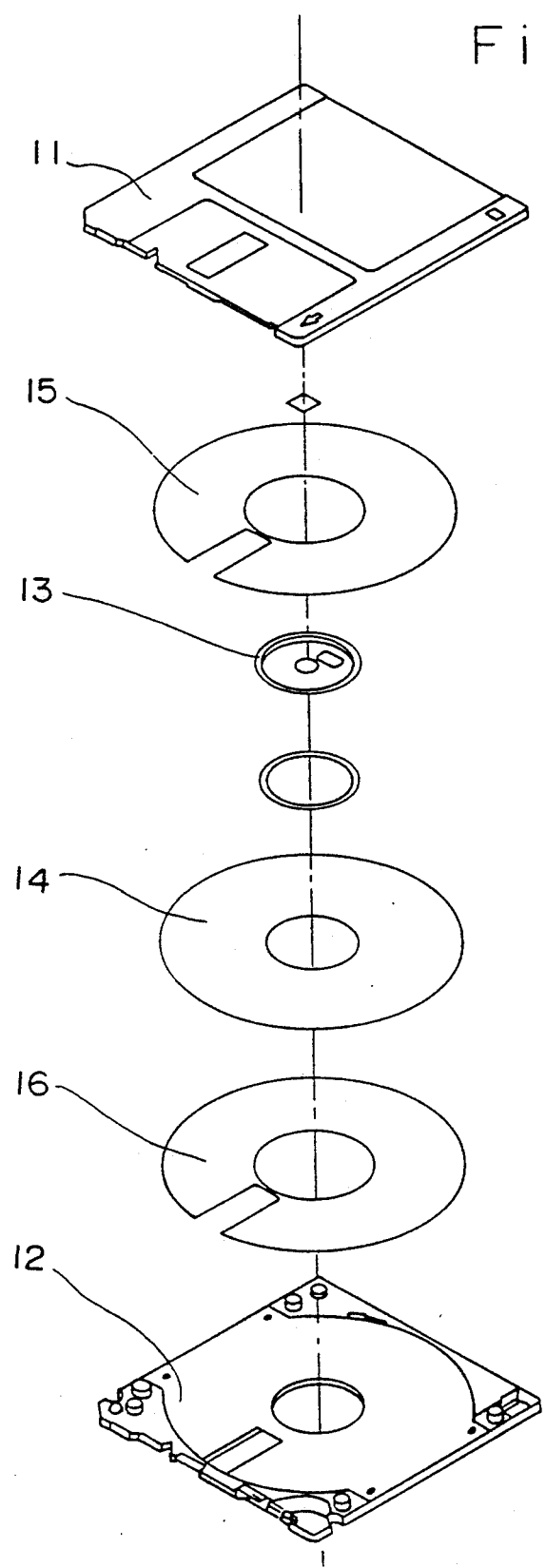
FIG. 1 is an exploded view of a magnetic disc housing equipped with a conventional disc hub.

As briefly outlined above, the present invention in one aspect is characterized by the formation of a plasma polymer film on the surface of sliding members in recording-playback devices or the like. While any monomer capable of being polymerized by virtue of plasma may be employed, one consisting substantially of only carbon and hydrogen gives a particularly desirable plasma polymer film.

To form a plasma polymer film on the surface of a sliding member, any known monomer gas may be used as desired. Examples are hydrocarbon monomers, such as methane, ethane, propane, butane, pentane, ethylene, propylene, butene, butadiene, acetylene, and methylacetylene; silicon monomers, such as tetramethoxysilane; hydrogen fluoride monomers, such as tetrafluoroethylene; and methyl methacrylate, etc.

In particular, the plasma polymer film consisting substantially of carbon and hydrogen alone constitutes a dense, pinhole-free, hard film on the substrate surface. It is preferred as a protective coating because of good wear resistance and the ability of maintaining outstanding stability for long time. Above all, the monomer at an H/C ratio of 1.5 or less in terms of the ratio of numbers of atoms (atomic composition ratio) affords a tridimensionally thoroughly crosslinked plasma polymer film of desirable properties. Such a plasma-polymerized protective film can be formed by decreasing the amount of the hydrocarbon monomer gas, lowering the reaction pressure, and increasing the applied electric power. Lowering the reaction pressure and increasing the applied power invite an increase in the decomposition energy per unit amount of the monomer used, with the result that decomposition proceeds to yield a crosslinked, plasma-polymerized protective film.

A plasma polymer film with a high index of refraction has great density, and the denseness and wettability make it more adhesive or bondable to the substrate. A desirable index of refraction is at least 1.8, more desirably between 1.8 and 2.3. If the index is too low the coefficient of friction increases to such a degree that the film is easily worn. Also, the film to be formed is desired to range in thickness from 100 to 5000 Å. If the thickness is below this range the wear resistance becomes insufficient, while too thick a film attains no more favorable effect but merely requires extended manufacturing time.

An anchor layer is formed by varying the film-forming conditions, especially by decreasing the energy density. The resulting film has an H/C of from 1.5 to 2.0 and a low index of refraction. In this manner a soft anchor layer of low Vickers hardness is obtained.

It is advisable to clean the surface of the substrate metal or plastic by ultrasonic washing with an organic solvent or the like prior to the formation of a plasma polymer film. Increasing the substrate metal or plastic surface beforehand helps achieve an even better result.

Plasma treatment of the substrate surface can improve its adhesion to a plasma polymer film. The plasma treatment is done by introducing a rare gas, such as Ar, He, or Ne, and a gas of $H_2$, $N_2$, CO, $CO_2$, $H_2O$, $NO_x$, $NO_2$, $NH_3$ or the like into a vacuum chamber and bringing the resulting plasma into contact with a work to be treated. The conditions usually used for plasma treatment are as follows: At a gas pressure of 0.01 to 10 Torr, either a direct or alternating current can be used as the power supply. In the case of AC supply, a frequency between 50 Hz and 5 Ghz may be used. Although the treating conditions vary with the geometry and quantity or volume of the work, it is usually possible to set power consumption to from 10 W to 10 Kw and treating time from 0.5 second to 10 minutes (Example 1).

The energy density suitable for forming a plasma polymer film as a protective coating according to the present invention, W/(FM), where W is the electric power for producing the plasma in J/sec, F is the feed gas flow rate in kg/sec, and M is the molecular weight of the feed gas, is at least $10^9$ J/kg. The energy density for forming an anchor layer ranges from $10^7$ to $10^9$ J/kg. Hydrogen or other inert gas may be used as a carrier gas. Thus, when the feed gas consists substantially of carbon and hydrogen alone, except for some inevitable impurity gas present, the resulting plasma polymer film will exhibit high wear resistance and good adhesion to the base metal. Increasing the temperature of the sliding member before forming the plasma polymer film gives a further beneficial effect.

The invention is illustrated by the following examples.

EXAMPLE 1 & COMPARATIVE EXAMPLES 1-2

A hub for a 3.5-in. disc shown in FIG. 1 was made. First, a blank hub of stainless steel was used (Comparative Example 1). The blank was placed in a plasma polymerizer, and a hydrocarbon polymer film was formed as an anchor layer on its surface at a pressure of 0.1 Torr, RF power of 350 W, and 20 SCCM $CH_4$. In the film-forming treatment an ellipsometer was used in measuring the film thickness. The resulting film was determined to have an H/C ratio of 1.6 by a secondary electron mass analyzer (SIMS). The index of refraction was 1.6 when measured with an ellipsometer.

Next, a hydrocarbon polymer film was formed as a protective coating on the substrate surface under the conditions of pressure 0.02 Torr, RF power 500 W, and $CH_4$ 5 SCCM. The film thickness was measured using an ellipsometer. The resulting film was found to have an H/C ratio of 1.15 by a SIMS. The index of refraction was 2.0 according to an ellipsometer reading (Example 1).

By way of reference, the procedure of Example 1 was repeated excepting the formation of the anchor layer, and the example is herein referred to as Comparative Example 2.

The Vickers hardness and film thickness values of the products in these samples were as shown in Table 1. The Vickers hardness was measured under a load of 10 g with a micro-Vickers meter.

Also, the friction coefficient, corrosion resistance, wear resistance, and surface roughness of each product were determined. The results are summarized in Table 2.

Test pins under a stress of 200 g were caused to slide likewise, and the abrasion depths were measured. At the same time, the protective film particles that came off from the sliding faces were collected by adhesion to Scotch tape pieces. The number of the particles per square millimeter was counted.

The number of defects on each test sliding surface was counted as that of 50 μm or larger particles found over the entire periphery along the sliding surface after 10000 sliding runs.

Diamond-like film formation

A diamond-like film suited for use in the present invention can be formed in a variety of ways, preferably by ionization evaporation. The term diamond-like as used herein means "like diamond", that is, having a crystal structure in which each atom is the center of a tetrahedron formed by its nearest neighbors. Diamond-like film exhibits a diamond structure when measured, for example, by X-ray defraction analysis. The preferred technique consists of introducing a hydrocarbon feed gas or a feed gas capable of producing a hydrocarbon upon decomposition or reaction into a vacuum, ionizing the gas, and guiding the ionized gas and depositing it on the metallic surface portion of a sliding member that constitutes a substrate to form a diamond-like thin film thereon. In this manner a sliding member can be completed. The process is advantageous over the others in that it can be practiced at lower temperatures and can produce films of better crystallinity with greater ease of quantity production.

As briefly described above, the present invention is characterized in forming a diamond-like film on the surface of sliding members of recording-playback devices. The film forming is preferably by ionization evaporation that produces a diamond-like film.

Ionization evaporation is a process in which a hydrocarbon feed gas or a feed gas capable of producing a hydrocarbon upon decomposition or reaction (the term "hydrocarbon" as used herein meaning any of saturated hydrocarbons, such as methane, ethane, and propane, and unsaturated hydrocarbons, such as ethylene, propylene, and acetylene; the feed gas capable of producing a hydrocarbon on decomposition being an alcohol, such as methyl alcohol or ethyl alcohol, or a ketone, such as acetone or methyl ethyl ketone or the like; the feed gas capable of producing a hydrocarbon gas on reaction being a mixed gas such as of carbon monoxide, carbon dioxide, and hydrogen or the like; the feed gas optionally containing at least one member of the family consisting of such rare gases as helium, neon, and argon, or hydrogen, oxygen, nitrogen, water, carbon monoxide, carbon dioxide and the like.) is ionized by such ionizing means as arc discharge between a cathode and an anti-cathode or by thermionic emission between cathode hot filaments and an anticathode, and the resulting ion beam is accelerated by an electric field and directed to the substrate, whereby a diamond-like film is formed on the substrate.

When the ion beam is fixed and the substrate moved, or conversely when the substrate is fixed and the ion beam in the form of a plasma of ionized hydrocarbon is allowed to scan deflectedly in the direction substantially perpendicular to the original direction, a diamond-like thin film can be formed over a broad substrate surface. Such a deflecting magnetic field can be created by the use of a permanent magnet or electromagnet which produces a magnetic field in the direction crossing that of acceleration of the ion beam.

The ionization evaporation that forms a technical basis of the present invention is described in U.S. patent application Nos. 59377/1988, 59376/1988, etc. Working examples of the present invention use a process and an apparatus based on the equipment described in these prior publications.

Figure 2:
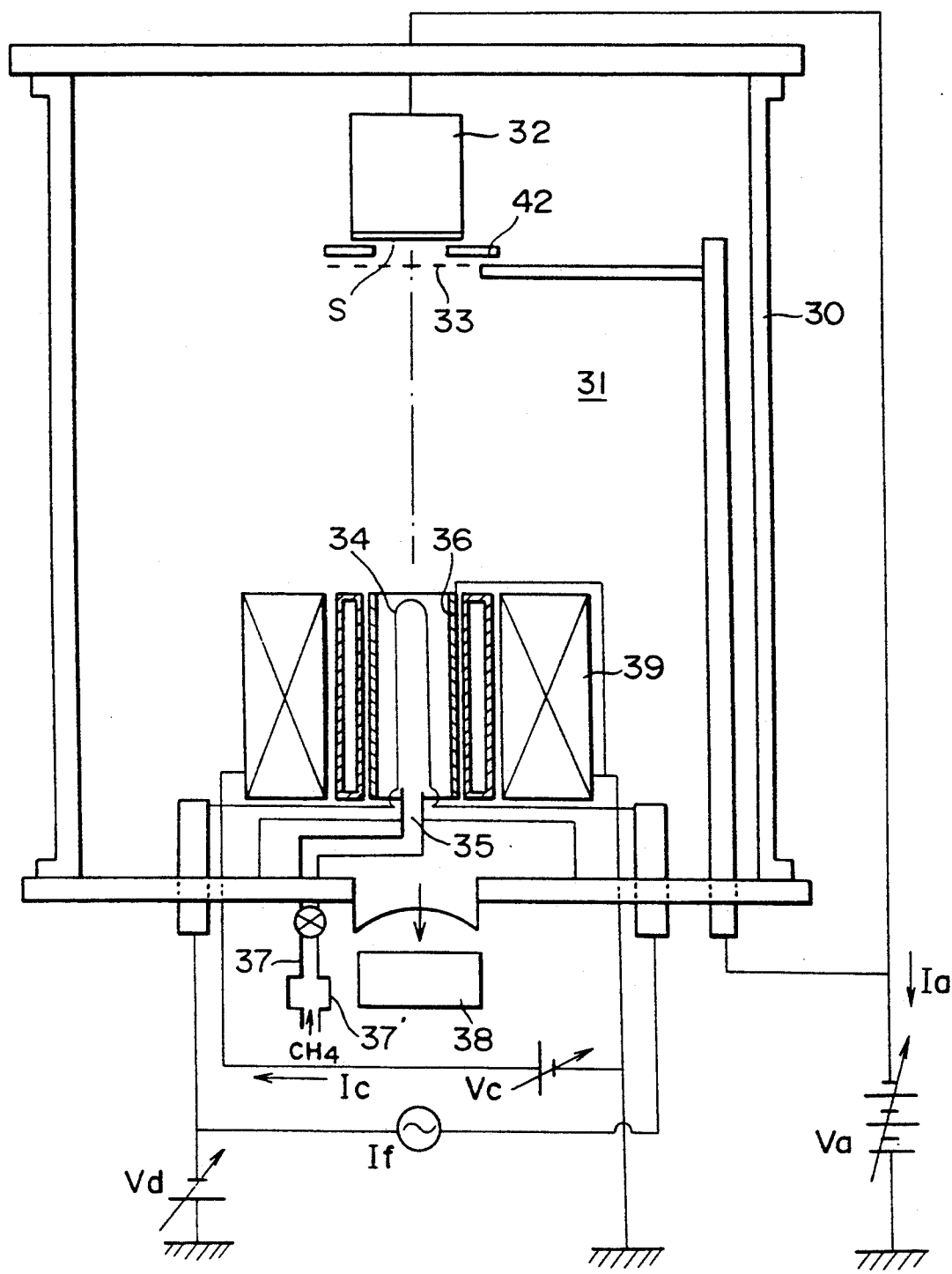
FIG. 2 is a schematic view of an ionization evaporation apparatus embodying which may be utilized in this invention.

In FIG. 2 is illustrated a preferred embodiment of a film-forming apparatus. The numeral 30 designates a vacuum vessel and 31 a chamber therein connected to an evacuation system 38 so as to be evacuated to a high vacuum up to about $10^{-6}$ Torr. The numeral 32 indicates an electrode located at the back of a substrate S which is fed in a given direction by suitable drive means, and in this case a voltage Va is applied to the electrode. At 33 is indicated a grid which is used to accelerate ions. Hot cathode filaments 34 are heated by an AC source If for thermionic emission and are kept at a negative potential. The numeral 35 indicates an inlet for feeding hydrocarbon gas as a starting material. An antielectrode 36 is disposed around the filaments 34 to apply a voltage Vc between itself and the filaments. A solenoid 39 surrounds the filaments 34, antielectrode 36, and feed inlet 35 to produce a magnetic field for the containment of ionized gas. It is thus possible to modify the quality of the resulting film through the adjustments of the voltages Vd and Va and the current in the solenoid.

In FIG. 2, a plasma excitation chamber 37' is provided on a line 37 which feeds the hydrocarbon gas, so as to enhance the efficiency of the ionization apparatus. For the plasma excitation, e.g., microwave, high frequency (RF) waves, radiant rays, or ultraviolet rays may be utilized.

The process of film forming will now be explained in detail with reference to FIG. 2 First, the chamber 31 is evacuated to a high vacuum of $10^{-6}$ Torr. A valve on the gas feed line 37 is manipulated to introduce methane gas or its mixture with hydrogen, with or without a carrier gas such as Ar, He, or Ne, at a predetermined flow rate via the inlet 35 into the chamber, while a desired gas pressure, e.g., $10^{-1}$ Torr, is maintained through control of the evacuation system 38. Meanwhile the plurality of hot cathode filaments 34 are heated with an alternating current If, and a potential difference Vd is applied across the filaments 34 and the anticathode 36 for an electric discharge. The methane gas from the feed inlet 35 is thermally decomposed and collides with the thermions from the filaments to generate positive ions and electrons. The electrons, in turn, collide with other thermally decomposed particles. The phenomenon is repeated under the containment action of the magnetic field of the solenoid until the methane gas is completely converted to positive ions of the thermally decomposed substance.

The positive ions are attracted by the negative potential Va applied to the electrode 32 and the grid 36. They are accelerated toward the slowly moving substrate S and impinge upon it to effect a film-forming reaction, whereby a diamond-like thin film is formed. If desired, a thin film of better quality can be obtained by the use of the afore-mentioned fixed magnet.

The thickness of the film to be formed preferably ranges from 100 to 10000 Å. If the film is thinner than the range its wear-resisting effect decreases and if too thick, no more favorable effect is attained despite the extension of production time.

Ultrasonic cleaning of the substrate with an organic solvent before the formation of a diamond-like thin film gives better result.

An anchor layer is formed under mild conditions using a low energy, while a protective coating is produced with a high energy. The anchor layer film can be easily formed with lowered Va, Vd, and Vb.

Further examples will be explained below.

EXAMPLE 2 & COMPARATIVE EXAMPLE 3

Using the hub of Comparative Example 1, the substrate was charged into the film-forming apparatus shown in FIG. 2. The vacuum chamber 10 was evacuated to $10^{-6}$ Torr, and then methane gas was introduced. At a gas pressure of $10^{-1}$ Torr, hot cathode filaments were allowed to cause an electric discharge. The magnetic flux density of the solenoid 39 was 400 gausses, the substrate voltage Va=200 V, Vd=30 V, and the substrate temperature 200° C. An alternating current If of 25 A was flown through the filaments 34.

The filaments were in the form of coils 3 mm wide surrounded by an electrode with a spacing of 8 mm in between, and the feed rate was 40 mm/hr.

Next, Va was changed to 450 V (the other conditions being left unchanged) and a diamond-like protective coating was made (Example 2).

For comparison, Example 2 was repeated with the omission of the anchor layer, the example being designated Comparative Example 3.

The Vickers hardness and film thickness of the hubs were determined, the values being given in Table 1. Other properties are shown in Table 2.

Ion plating

An ion-plating film suited for use in the present invention can be formed in many different ways. Ion plating involves evaporation and ionization of a material metal for deposition on a substrate. An arc discharge technique which utilizes arc discharge in ionizing a metal vapor is used in the following examples of the invention.

The metal that can be used satisfactorily in forming a film on the metallic substrate surface of sliding members is any of metals selected from among Cr, Hf, Ti, Zr, Mo, W, and B; nitrides of Cr, Hf, Ti, Zr, and B; carbides of Cr, Hf, Ti, Zr, Si, and B; oxides of Ti, Zr, Si, and B; and their composites and the like.

It is desirable before forming an anchor layer on the substrate metal surface of a sliding member to activate the surface by the afore-described plasma treatment. The prior activation may be replaced or followed by ultrasonic cleaning with alcohol, acetone, flon or the like.

The anchor layer is formed from a soft metal or metallic compound. The protective coating is made from a compound of the metal of the anchor layer or from a metallic compound of a lower metal content than the metallic compound of the anchor layer. Thus, the protective coating has a higher Vickers hardness than the anchor layer. Among exemplary combinations of anchor layer and protective coating materials are TiN-Ti and TiC-Ti.

Figure 3:
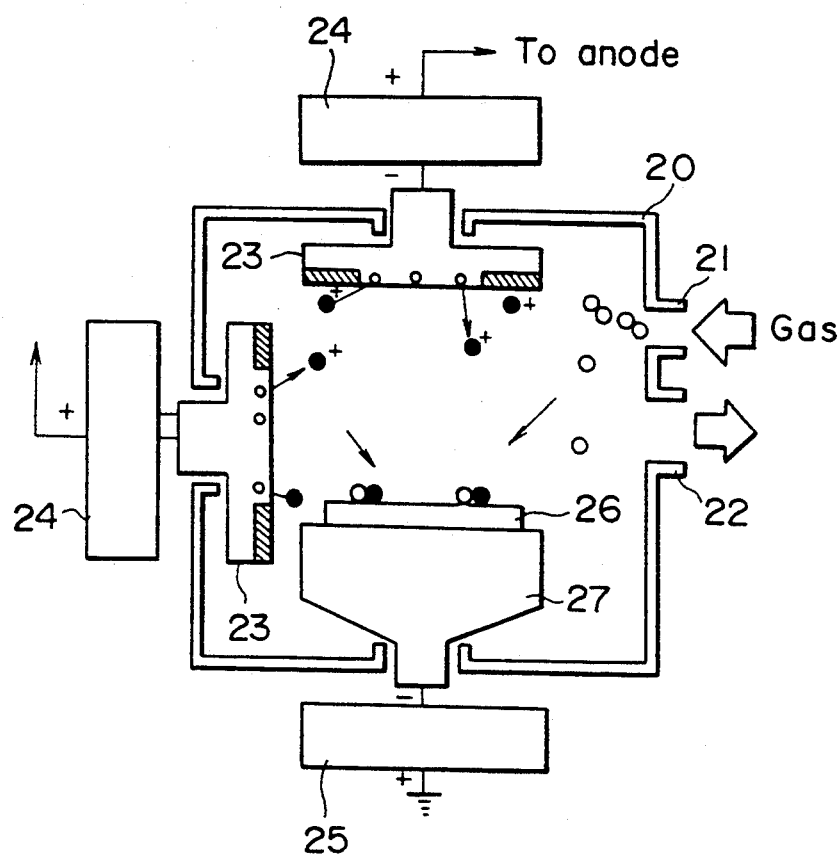
FIG. 3 is a schematic view of a typical ion plating apparatus which may be utilized in the present invention.

The film-forming procedure will now be described in detail with reference to FIG. 3 illustrating an arc discharge apparatus.

A vacuum chamber 20 is evacuated to a high vacuum of about $10^{-6}$ Torr, and a valve of feed gas line 21 is manipulated to admit a reactive gas, such as nitrogen, oxygen, or methane, or an inert gas, such as Ar, He, or Ne, or their gaseous mixture into the chamber at a predetermined flow rate. Meanwhile, the pressure inside is adjusted, e.g., to $10^{-4}$ Torr, through control of an evacuation system 22. Sources (targets) 23 for metal vapor of Cr, Ti or the like are provided as cathodes. As arcing currents (about 70 to about 200 A each) from arc sources 24 are flown between the cathodes and an anode (not shown), the arcs as arc spots run about at random on the planes of the cathodes 23. The metal at spotted portions is instantly vaporized and ionized, and the ions fly out in the vacuum. The ions then are deposited and grown into a film on a substrate (in this case a disc hub) 26 held by a substrate holder 27 (a turntable, which may be replaced by a fixed holder) negatively biased by a biasing power source 25. The potential, amperage, temperature, and other conditions of the individual parts may be suitably selected in accordance with the literature concerned.

The thickness of the film thus formed is desirably between 1 and 2 micrometers. If the thickness is less than the range the wear resistance is inadequate, and if the film is too thick it attains no more favorable effect but takes extended time to produce.

More examples of the invention will be detailed below.

EXAMPLES 3-4 & COMPARATIVE EXAMPLE 4

Using the apparatus illustrated in FIG. 3, the hub of Comparative Example 1 was protectively coated. A substrate was placed in the film-forming apparatus shown in FIG. 3 and described above, and an anchor layer was formed on the substrate. Ti was chosen as a metal, and a Ti ion-plating film was formed on the substrate surface in a vacuum with an arcing current of 100 A.

Next, a protective coating was applied. Using Ti as a metal, an ion-plating film was formed on the substrate surface under the conditions of $N_2$ gas, $10^{-4}$ Torr, 5 SCCM, and arcing current 100 A (Example 3). In another run, this protective coating was replaced with an ion-plating film using Ti as a metal but formed under the conditions of $CH_4$ gas, $10^{-4}$ Torr, 200 SCCM, and arcing current 100 A (Example 4).

A further example in which the procedure of Example 3 was repeated with the exception that the anchor layer was not incorporated is designated Comparative Example 4.

The properties of the products determined are listed in Tables 1 and 2.

EXAMPLE 5

The substrate of Comparative Example 1 was used and Si was chosen as a metal. In the same way as in Example 1, Si layer was formed as an anchor layer. Then an ion-plating film was formed on the substrate surface under the conditions of Si, $CH_4$ gas, $10^{-4}$ Torr, 5 SCCM, and arcing current of 80 A.

The results are given in Tables 1 and 2.

EXAMPLES 6, 7, and 8

Substrates of the same type as shown in Example 1 were used and the protective coatings of Examples 4 and 5 and the protective coating of Example 3 were used, respectively, as protective coatings and anchor layers, the products being referred to as Examples 6 and 7. Another product having an anchor layer of alumina and the protective coating of Example 5 is designated Example 8.

Their properties measured are given in Tables 1 and 2.

The measurements were made by the following methods. All the products gave surface roughness values between 0.95 and 1.10 μm when measured with a tracer type surface roughness meter.

1) Friction

A measuring pin of stainless steel with hard chromium plating was moved in sliding contact with each hub surface, and the forces the pin received were measured using a strain gauge.

2) Wear resistance

A measuring pin, rounded at the tip to a radius of 5 mm and hard chromium plated, was caused to slide repeatedly over each test specimen surface. After 1000 runs the abrasion depth was measured by means of a surface roughness meter.

3) Hardness

Silicon wafers were coated under identical conditions with the hub specimens, and the thickness of the resulting films was measured using an ultramicro-hardness meter.

4) Film thickness and film-forming rate

These were measured using a quartz-oscillation type film thickness monitor. The N/metal ratio was determined by ESCA.

5) Corrosion resistance

Each test piece was sandblasted using alumina powder as the abrasive and then immersed in a 3% NaCl solution. The time period it required to begin rusting was measured. The symbol "x" stands for no more than one full day, "Δ" for one day to one week, and "O" for a longer period.

It will be clear from Tables 1 and 2 that a protective coating of low peelability and high corrosion resistance can be formed inexpensively with good productivity by one and the same process and with adequate binding force on the surface of sliding members by forming (a) a hydrocarbon or hydrocarbon-based plasma polymer film as an anchor layer and another hydrocarbon or hydrocarbon-based plasma polymer film of greater hardness than the anchor layer as a protective coating, or (b) a diamond-like film as an anchor layer and a diamond or diamond-like film of greater hardness than the anchor layer as a protective coating, or (c) an ion-plating film of a metal or metallic compound as an anchor layer and an ion-plating film of a metallic compound of greater hardness than the anchor layer as a protective coating. Thus, improvements in sliding members render it possible to prevent dropout or decrease in output of recording media with which the members are associated.

Specifically, when the protective coating is a plasma polymer film, the above conditions are easily satisfied in a continuous process by forming the anchor layer as a plasma polymer film of a lower energy density than the protective coating.

Specifically, when the protective coating is a diamond or diamond-like film, the above conditions are easily satisfied in a continuous process by forming the anchor layer as a diamond-like film of a lower density than the protective coating.

Specifically, when the protective coating is an ion-plating film, the above conditions are easily satisfied in a continuous process by forming the protective film from TiC, TiN, SiC, BN, $Al_2O_3$, or CrN and the anchor layer as a metallic compound film which contains the same type of metal as used in the protective coating and is enriched in the particular metal or is of a lower hardness than the coating.

TABLE 1

|  |  | Protective coating | | | | Anchor layer | | | |
| --- | --- | --- | --- | --- | --- | --- | --- | --- | --- |
|  |  | Film formed by | Material | Hardness | Film (μm) thickness | Film formed by | Material | Hardness | Film (μm) thickness |
| Comp. Ex. 1 | Untreated |  | Stainless steel | 200 | — |  |  |  |  |
| Ex. 1 | Anchored | Plasma | $CH_4$ | 2000 | 0.1 | Plasma | $CH_4$ | 700 | 0.1 |
| 2 | " | DLC | $CH_4/H_2$ | 5000 | 1.0 | DLC | $CH_4/H_2$ | 2500 | 0.5 |
| 3 | " | Ion plating | TiN | 2500 | 0.5 | Ion plating | Ti | 350 | 2.5 |
| 4 | " | " | TiC | 3000 | 1.0 | " | Ti | 350 | 2.0 |
| 5 | " | " | SiC | 3000 | 1.5 | " | Si | 1000 | 1.5 |
| 6 | Multilayered | " | SiC | 3000 | 2.5 | " | TiN | 2500 | 0.5 |
| 7 | " | " | TiC | 3000 | 1.0 | " | " | 2500 | 1.0 |
| 8 | " | " | SiC | 3000 | 2.5 | " | $Al_2O_3$ | 2200 | 0.5 |
| Comp. Ex. 2 | Not anchored | Plasma | $CH_4$ | 2000 | 0.1 |  |  |  |  |
| 3 | " | DLC | $CH_4/H_2$ | 5000 | 2.0 |  |  |  |  |
| 4 | " | Ion plating | TiN | 2500 | 0.5 |  |  |  |  |

TABLE 2

|  |  |  | Stress test | | |
| --- | --- | --- | --- | --- | --- |
|  | Friction (g · cm) | Wear resistance (μm) | Abrasion test | No. of metal particles peeled off (pc/$mm^2$) | No. of defects (pc) |
| Comp. Ex. 1 | 9.5 | 1.0 | 15.0 | 1000 | 15 |
| Ex. 1 | 9.0 | 0.2 | 1.0 | 100 | 5 |
| 2 | 7.0 | ≈0 | ≈0 | 0 | 0 |
| 3 | 9.1 | 0.1 | 0.5 | 10 | 2 |
| 4 | 8.9 | 0.05 | 0.2 | 5 | 1 |
| 5 | 8.8 | 0.05 | 0.2 | 5 | 1 |
| 6 | 8.9 | 0.05 | 0.2 | 5 | 1 |
| 7 | 8.7 | 0.05 | 0.2 | 5 | 1 |
| 8 | 8.9 | 0.05 | 0.2 | 5 | 1 |
| Comp. Ex. 2 | 9.0 | 0.25 | 5.0 | 350 | 10 |
| 3 | 7.0 | ≈0 | 1.2 | 110 | 7 |
| 4 | 9.1 | 0.15 | 3.0 | 150 | 7 |

What is claimed is:

1. A sliding member provided with a protective film which comprises:
   a sliding member body made of a stainless steel;
   an anchor layer formed on the surface of the body, said anchor layer consisting of a film selected form the group of
   (a) a hydrocarbon plasma polymer film consisting of carbon and hydrogen and having an H/C value of about 1.5 to about 2.0 and (b) a diamond film formed by ionization evaporation and having a vickers hardness of about 2,500 kg/mm²; and a protective coating formed on the anchor layer, said protective coating consisting of a film selected from the group of (a') hydrocarbon plasma polymer film consisting of carbon and hydrogen and having an H/C value of about 1.5, the H/C value of the plasma polymer film of the protective coating being less than that of the anchor layer when the anchor layer consists of (a), said hydrocarbon plasma polymer film having a thickness in the range of about 100 Å to about 5000 Å, and (b') a diamond film formed by ionization evaporization having a Vickers hardness of at least about 5,000 kg/mm² when the anchor layer consists of (b), said diamond film having a thickness in the range of about 100 Å to about 1000 Å.

* * * * *